(12) United States Patent
Lin et al.

(10) Patent No.: US 12,055,498 B2
(45) Date of Patent: Aug. 6, 2024

(54) DATA PROCESSING METHOD AND SYSTEM FOR DETECTION OF DETERIORATION OF SEMICONDUCTOR PROCESS KITS

(71) Applicant: TOP TECHNOLOGY PLATFORM CO., LTD., Hsinchu (TW)

(72) Inventors: Chyuan-Ruey Lin, Hsinchu (TW); Feng-Min Shen, Hsinchu (TW); Hung-Chia Su, Hsinchu (TW)

(73) Assignee: TOP TECHNOLOGY PLATFORM CO., LTD., Hsinchu (TW)

( * ) Notice: Subject to any disclaimer, the term of this patent is extended or adjusted under 35 U.S.C. 154(b) by 489 days.

(21) Appl. No.: 17/361,026

(22) Filed: Jun. 28, 2021

(65) Prior Publication Data

US 2022/0283099 A1 Sep. 8, 2022

(30) Foreign Application Priority Data

Mar. 6, 2021 (TW) .................................. 110108037

(51) Int. Cl.
*G01N 21/95* (2006.01)
*G01N 21/01* (2006.01)
(Continued)

(52) U.S. Cl.
CPC ....... *G01N 21/9501* (2013.01); *G01N 21/658* (2013.01); *G01N 21/8851* (2013.01); *G01N 21/95607* (2013.01); *G01N 21/01* (2013.01); *G01N 21/65* (2013.01); *G01N 21/8806* (2013.01); *G01N 2021/8854* (2013.01); *G01N 2021/8877* (2013.01); *G01N 21/94* (2013.01); *G01N 21/95* (2013.01); *G01N 21/956* (2013.01);
(Continued)

(58) Field of Classification Search
CPC ............. G01N 21/9501; G01N 21/658; G01N 21/8851; G01N 21/95607; G01N 2021/8877; G01N 2021/95615; G01N 2201/126; G01N 21/94; G01N 21/95; G01N 21/65; G01N 21/8806; G01N 21/956; G01N 21/01; G01N 2021/8854; G05B 2219/37507; G05B 2219/45031; G05B 19/41875; G05B 23/0283; H01L 22/30
See application file for complete search history.

(56) References Cited

U.S. PATENT DOCUMENTS

| | | | |
|---|---|---|---|
| 2005/0211004 A1* | 9/2005 | Fink | G01B 3/50 73/865.9 |
| 2019/0063678 A1* | 2/2019 | Ganiger | F01M 11/10 |
| 2019/0211444 A1* | 7/2019 | Montes | C23C 16/4404 |

FOREIGN PATENT DOCUMENTS

| | | | |
|---|---|---|---|
| CN | 105223185 A | * | 1/2016 |
| TW | M605380 U | * | 12/2020 |

* cited by examiner

*Primary Examiner* — Manish S Shah
*Assistant Examiner* — Christian T Bryant
(74) *Attorney, Agent, or Firm* — MUNCY, GEISSLER, OLDS & LOWE, P.C.

(57) ABSTRACT

A data processing method for detection of deterioration of semiconductor process kits includes the following steps: acquiring a plurality of Raman spectra data of a semiconductor process kit and performing a plurality calculating processes on the Raman spectra data to obtain a first deterioration state determining parameter indicating the aging degree of the entire semiconductor process kit and a second deterioration state determining parameter indicating the degree of variation of the internal molecular structure of the semiconductor process kit.

7 Claims, 4 Drawing Sheets

(51) Int. Cl.
  *G01N 21/65*   (2006.01)
  *G01N 21/88*   (2006.01)
  *G01N 21/94*   (2006.01)
  *G01N 21/956*  (2006.01)
  *G05B 19/418*      (2006.01)
  *G05B 23/02*       (2006.01)
  *H01L 21/66*       (2006.01)
(52) U.S. Cl.
  CPC .............. *G01N 2021/95615* (2013.01); *G01N 2201/126* (2013.01); *G05B 19/41875* (2013.01); *G05B 23/0283* (2013.01); *G05B 2219/37507* (2013.01); *G05B 2219/45031* (2013.01); *H01L 22/30* (2013.01)

DATA PROCESSING METHOD AND SYSTEM FOR DETECTION OF DETERIORATION OF SEMICONDUCTOR PROCESS KITS

TECHNICAL FIELD

The present invention relates to a data processing method and system and particularly to a data processing method and system for detection of deterioration of semiconductor process kits.

BACKGROUND

The semiconductor manufacturing yield rate is greatly affected by the proper rate of the semiconductor process kits used in the semiconductor production equipment. Any minute defects of the semiconductor process kits or any tiny molecules remaining on the surface of the semiconductor process kits may become a pollution source in the semiconductor manufacturing process. In the high-end manufacturing processes, due to the shrinkage of the line width, the tiny molecules that previously unaffected the yield rate may seriously affect the semiconductor manufacturing quality, and the extremely harsh semiconductor process environment is highly likely to cause deterioration of the semiconductor process kits. Therefore, keeping abreast of the deterioration state of the semiconductor process parts is an important requirement in high-end semiconductor manufacturing processes.

At present, it is achieved by experiences or through testing tools to keep abreast of the deterioration of the semiconductor process kits. However, relying solely on the experiences usually resulted in that the semiconductor process kits are often decommissioned when they are still in a usable state, which has a disadvantage of low utilization efficiency; on the other hand, the currently available testing tools can only measure the size change of these process kits. The property changes of the semiconductor process kits before and after the occurrence of micro-defects cannot be accurately known. In other words, in the high-end semiconductor manufacturing processes, neither relying on the experiences nor through testing tools is enough to accurately determine the actual quality of the semiconductor process kits. Especially, a new product of the semiconductor process kits may have deterioration and relying only on new or old life cycle to determine the deterioration state of the semiconductor process kits is no longer sufficient for the needs of the high-end semiconductor manufacturing processes.

To solve this problem and meet the high-end process requirements, the applicant of the present application has proposed an accurate deterioration detecting system for the semiconductor process kits. However, the detected results are multidimensional spectral data and not very convenient to interpret. In order to improve the convenience of interpretation, there is still a need for a data processing tool which suits the deterioration detecting system to convert the spectral data into data that is convenient for interpretation. In addition, it is also desired that the converted data can be used to predict the lifetime of various semiconductor process kits, so as to early aware of the use state of each semiconductor process kit and make sure that each semiconductor process kit being used is in the best condition and the semiconductor process kits with severe deterioration which may affect the semiconductor manufacturing yield can be avoided from using.

SUMMARY

In view of the above issues, the present application proposes a data processing method and system for detection of deterioration of a semiconductor process kit. The data processing method and system is used to produce deterioration state determining parameters to predict the lifetime of various semiconductor process kits.

In one implement aspect, the present invention proposes a data processing method for detection of deterioration of semiconductor process kits.

In one embodiment, the proposed data processing method includes the following steps: acquiring a plurality of Raman spectra data of a semiconductor process kit; and performing a plurality calculating processes on the Raman spectra data to obtain a first deterioration state determining parameter indicating the aging degree of the semiconductor process kit and a second deterioration state determining parameter indicating the degree of variation of the internal molecular structure of the semiconductor process kit.

In one embodiment, the calculating processes performed includes the following steps: performing at least two-dimensional alignment calculation on the acquired Raman spectra data; performing derivative calculation on the Raman spectra data resulted from the alignment calculation to obtain a first parameter; performing scaling and normalization on the first parameter to obtain a second parameter; performing dimension reduction calculation on the second parameter to obtain a third parameter; and performing standard deviation calculation on the third parameter to obtain the first deterioration state determining parameter and the second deterioration state determining parameter.

In one embodiment, the derivative calculation performed includes the following steps: performing ratio calculation with respect to different dimensions on the gaps between any two of all the spectral peaks of each of the Raman spectra data to obtain the first parameter representing changes of the strength of all the spectral peaks of each of the Raman spectra data as the Raman spectra shift changes.

In one embodiment, the alignment calculation, the scaling and normalization, or the dimension reduction calculation may include a matrix operation.

In one embodiment, the first deterioration state determining parameter relates to an average value resulted from the standard deviation calculation, and the second deterioration state determining parameter relates to a discrete value resulted from the standard deviation calculation.

In another implementation aspect, the present invention proposed a data processing system for detection of deterioration of semiconductor process kits.

In one embodiment, the proposed data processing system includes an alignment calculation unit, a derivative calculation unit, a scale normalization unit, a dimension reduction calculation unit, and a standard deviation calculation unit. The alignment calculation unit receives a plurality of Raman spectra data of a semiconductor process kit and performs error unification calculation on the Raman spectra data with respect to all dimensions to eliminate inconsistency of the detection results of the semiconductor process kit under detection within different deterioration detecting system of semiconductor process kits. The derivative calculation unit is electrically connected with the alignment calculation unit to receive the Raman spectra data resulted from the alignment calculation unit and to perform ratio calculation with respect to different dimensions on the gaps between any two of all the spectral peaks of each of the resulted Raman spectra data to obtain a first parameter representing changes of the strength of all the spectral peaks of each of the Raman spectra data as the Raman spectra shift changes. The scale normalization unit is electrically connected with the derivative calculation unit to receive the first parameter and to perform scaling and normalization on the first parameter to obtain a second parameter. The dimension reduction calculation unit is electrically connected with the scale normalization unit to receive the second parameter and to perform dimension reduction calculation on the second parameter to obtain a third parameter. The standard deviation calculation unit is electrically connected with the dimension reduction calculation unit to receive the third parameter and to perform standard deviation calculation on the third parameter to obtain a first deterioration state determining parameter indicating the aging degree of the semiconductor process kit and a second deterioration state determining parameter indicating the degree of variation of the internal molecular structure of the semiconductor process kit.

In one embodiment, the first deterioration state determining parameter is life index of the semiconductor process kit with the life index reflecting the aging degree of the semiconductor process parts.

In one embodiment, the life index relates to an average value resulted from the standard deviation calculation.

In one embodiment, the second deterioration state determining parameter is the discrete degree of the semiconductor process kit with the discrete degree reflecting the degree of variation of the internal molecular structure of the semiconductor process kit.

In one embodiment, the discrete degree relates to a discrete value resulted from the standard deviation calculation.

In sum, the data processing method and system for deterioration detection of semiconductor process kits according to the described embodiments of the present invention are utilized to obtain the life index and discrete degree for predicting the lifetime of various semiconductor process kits via performing algorithm including alignment calculation, derivative calculation, scale normalization, dimensional reduction calculation, and standard deviation calculation on the detected Raman spectra data. Since the life index and discrete degree are one-dimensional data converted from the detected Raman spectra data, the interpretation complexity of the Raman spectra data is reduced, the detection personnel can keep abreast of the use state of various semiconductor process kits without interpreting the Raman spectra data, the lifetime of various semiconductor process kits can be predicted based on only the numerical value of the life index and the discrete degree, and therefore the use efficiency of the semiconductor process kits can be improved.

BRIEF DESCRIPTION OF DRAWINGS

The following detailed descriptions, given by way of example, and not intended to limit the present invention solely thereto, will be best be understood in conjunction with the accompanying figures.

DETAILED DESCRIPTION OF THE EMBODIMENTS

The present invention discloses a data processing method and system for detection of deterioration of semiconductor process kits. Any description in the following which is considered to be understood by the persons skilled in the art, such as knowledge of the Raman spectra, would not be described in detail. Additionally, the technical terms in the following should be interpreted according to its ordinary meaning or the meaning as described. The figures referred in the following description may not be plotted in real scale but only intended to show the features and technical meanings of this invention and do not limit the scope of the invention.

In the present invention, the mentioned semiconductor process kits are the parts used in the semiconductor manufacturing process. In most cases, the semiconductor process kits are made of an inorganic material. The semiconductor process kits may include but not limited to the Si rings applied in the etching process; the Quartz parts such as Quartz tube, Quartz cassette, Quartz ring, Quartz cell, and Quartz heater applied in the etching or deposition process; the ceramic parts such as that of $Al_2O_3$ applied in a semiconductor chamber or with a wafer transportation; and the coatings, such as of $Y_2O_3$ or YAG, applied in the interior of a semiconductor device or the protective parts with resistance to plasma etching applied inside a semiconductor chamber.

Figure 1:
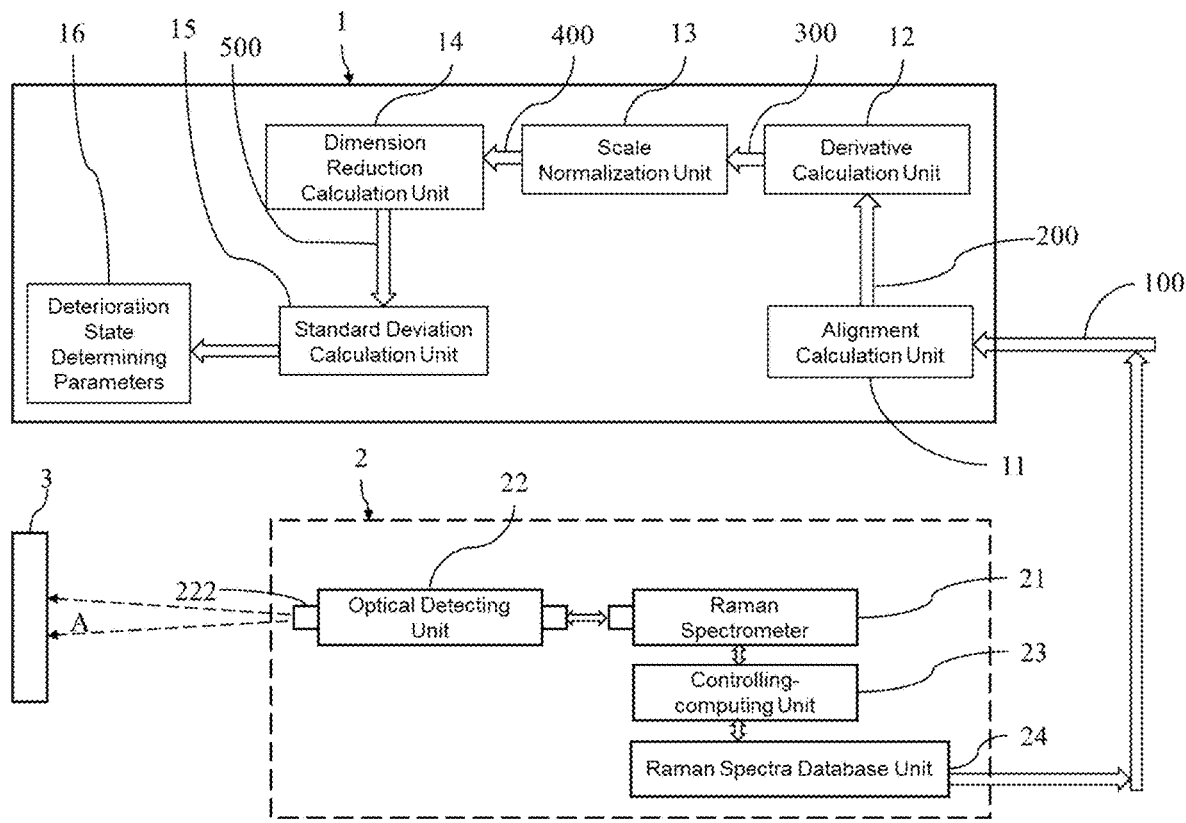
FIG. 1 is a schematic system diagram showing a data processing system for deterioration detecting system of semiconductor process kits according to one embodiment of the present invention.

FIG. 1 is a schematic system diagram showing a data processing system for deterioration detecting system of semiconductor process kits according to one embodiment of the present invention. Referring to FIG. 1, in one embodiment, a data processing system 1 for a deterioration detecting system 2 of a semiconductor process kit 3 under detection is connected to the deterioration detecting system 2 and receives detected data from the deterioration detecting system 2 of the semiconductor process kit 3. The data processing system 1, which may be a computing system having a microprocessor, includes an alignment calculation unit 11, a derivative calculation unit 12, a scale normalization unit 13, a dimension reduction calculation unit 14, and a standard deviation calculation unit 15. The microprocessor may be electrically connected with the alignment calculation unit, the derivative calculation unit, the scale normalization unit, the dimension reduction calculation unit, and the standard deviation calculation unit to execute all the calculations. The alignment calculation unit 11 and the derivative calculation unit 12 are electrically connected, the derivative calculation unit 12 and the scale normalization unit 13 are electrically connected, the scale normalization unit 13 and the dimension reduction calculation unit 14 are electrically connected, and the standard deviation calculation unit 15 and the dimension reduction calculation unit 14 are electrically connected. The deterioration detecting system 2 includes at least a Raman spectrometer 21, an optical detecting unit 22 adapted to the Raman spectrometer 21, a controlling-computing unit 23 adapted to the Raman spectrometer 21, and a Raman spectra database unit 24 adapted to the controlling-computing unit 23. The optical detecting unit 22 is connected to the Raman spectrometer 21. The Raman spectrometer 21 and the Raman spectra database unit 24 are connected to the controlling-computing unit 23. In this embodiment, the deterioration detecting system 2 mainly utilizes the Raman spectrometer 21 and the optical detecting unit 22 adapted to the Raman spectrometer 21 to perform the deterioration detection on the semiconductor process kit 3 under detection. The Raman spectra database unit 24 has capacity of receiving, outputting, and storing Raman spectra data and may be implemented as a memory, hard disk, or a cloud storage system. In one embodiment, the Raman spectra database unit 24 is provided to store a plurality of Raman spectra data corresponding to a plurality of known use hours, a plurality of known materials, a plurality of known material compounds, or a plurality of known deterioration states of the materials of various semiconductor process kits and to store the Raman spectra data detected from the semiconductor process kit 3 under detection. In other embodiments, the data processing system 1 not only receives the Raman spectra data from the Raman spectra database unit 24 but also receives the Raman spectra data otherwise inputted. The data processing system 1 functions to finally produce deterioration state determining parameters 16 which can be used to predict lifetime of the semiconductor process kit 3 under detection or other specific semiconductor process kits. In this manner, one can early aware of the deterioration state of the semiconductor process kit 3 under detection or other specific semiconductor process kits. The deterioration state determining parameters 16 include at least life index and discrete degree these two parameters. The life index represents and/or indicates the aging degree of the semiconductor process kit 3 under detection or the specific semiconductor process kits in different external environments, while the discrete degree represents and/or indicates degree of variation of the internal molecular structure of the semiconductor process kit 3 under detection or the specific semiconductor process kits at different internal locations.

Again, referring to FIG. 1, in one embodiment, the Raman spectrometer 21 emits a light beam such as a laser light beam which passes the optical detecting unit 22 and then projects on the semiconductor process kit 3 under detection, and the semiconductor process kit 3 scatters a light with an exciting Raman spectrum signal which is to be detected. In one embodiment, the optical detecting unit 22 may include two optical fibers of which one is used to guide the light beam emitted from the Raman spectrometer 21 to pass the optical projecting port 222 and reach a targeted area A of the semiconductor process kit 3 under detection while the other one is used to guide the light scattered at the targeted area A having the excited Raman spectrum signal to be received by the optical detecting unit 22 through the optical projecting port 222 and then received by the Raman spectrometer 21. The targeted area A is an area to effectively receive the light beam emitted from the Raman spectrometer 21 and then projected onto the semiconductor process kit 3 under detection through the optical detecting unit 22. In one embodiment, the light beam projected to the targeted area A may focus on a circular spot with a finite area.

Referring again to FIG. 1, in one embodiment, the Raman spectra database unit 24 is connected to the controlling-computing unit 23 and stores a plurality of Raman spectra data corresponding to a plurality of known use hours such as 50, 100, 150 . . . 500 hours of the semiconductor process kit 3 under detection, a plurality of known materials of the semiconductor process kit 3 under detection, a plurality of known material compounds of the semiconductor process kit 3 under detection, or a plurality of known deterioration states or deterioration parameters of the materials of the semiconductor process kit 3 under detection. The deterioration parameters are the parameters used to represent and/or indicate the degree or percentage of the deterioration.

Figure 2:
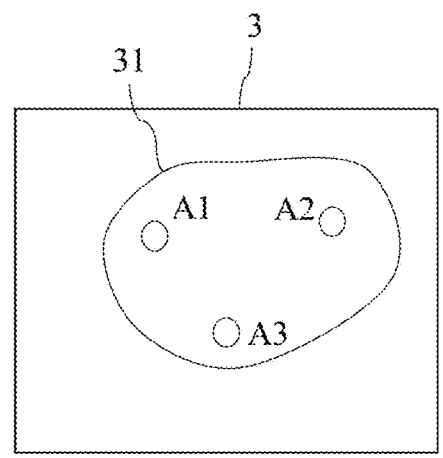
FIG. 2 is a schematic plane diagram showing a plurality of targeted areas in a plane of a semiconductor process kit under detection of the deterioration detecting system of semiconductor process kits in FIG. 1.

FIG. 2 is a schematic plane diagram showing a plurality of targeted areas in a plane of a semiconductor process kit under detection of the deterioration detecting system of semiconductor process kits in FIG. 1. Referring to FIG. 1 and FIG. 2, the size of the semiconductor process kit 3 under detection may be large or small and is not limited herein. In one embodiment, a plurality of separated targeted areas such as A1, A2, A3 as shown in FIG. 2 are detected to ensure the effectiveness of the detection results. The number of the targeted areas required depends on and may increase with the size of the area 31 to be detected. The so-called area 31 to be detected is an area of the semiconductor process kit 3 under detection having the highest deterioration rate. For example, the area 31 may be the area frequently applied with plasma etching in a semiconductor process. Depending on the actual requirements, the targeted areas A1, A2, A3 as shown in FIG. 2 may be same or different in size and preferably be same.

Figure 3:
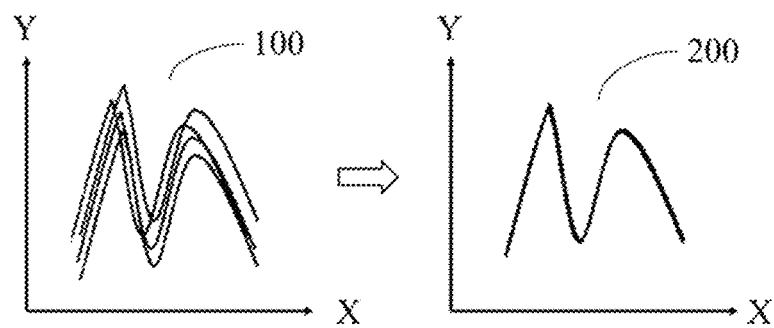
FIG. 3 is a schematic plane diagram showing a plurality of Raman spectra data before and after being processed by an alignment calculation unit of the data processing system for deterioration detecting system of semiconductor process kits according to one embodiment of the present invention.

Referring continuously to FIG. 1, in one embodiment, the alignment calculation unit 11 of the data processing system 1 for deterioration detecting system of semiconductor process kits is used to receive various of Raman spectra data detected with different deterioration detecting systems of the same semiconductor process kit 3 under detection. The Raman spectra data to be received include the Raman spectra data stored in the Raman spectra database unit 24 of the targeted areas A1, A2, A3 of the semiconductor process kit 3 under detection. The alignment calculation unit 11 also performs error unification calculation such as a matrix operation on the received Raman spectra in all dimensions to eliminate inconsistency of the detection results of the semiconductor process kit 3 under detection within the different deterioration detecting systems. Since the Raman spectra data is multidimensional and includes data composed of components in at least two dimensions such as the X axis and the Y axis, the alignment calculation of the Raman spectra data includes alignment calculations with respect to at least the X axis and the Y axis for the coordinate values. As shown in FIG. 1 and FIG. 3, the two-dimensional Raman spectra data 100 having various inconsistent errors is converted to the Raman spectra data 200 having a consistent error after the alignment calculation.

Figure 4:
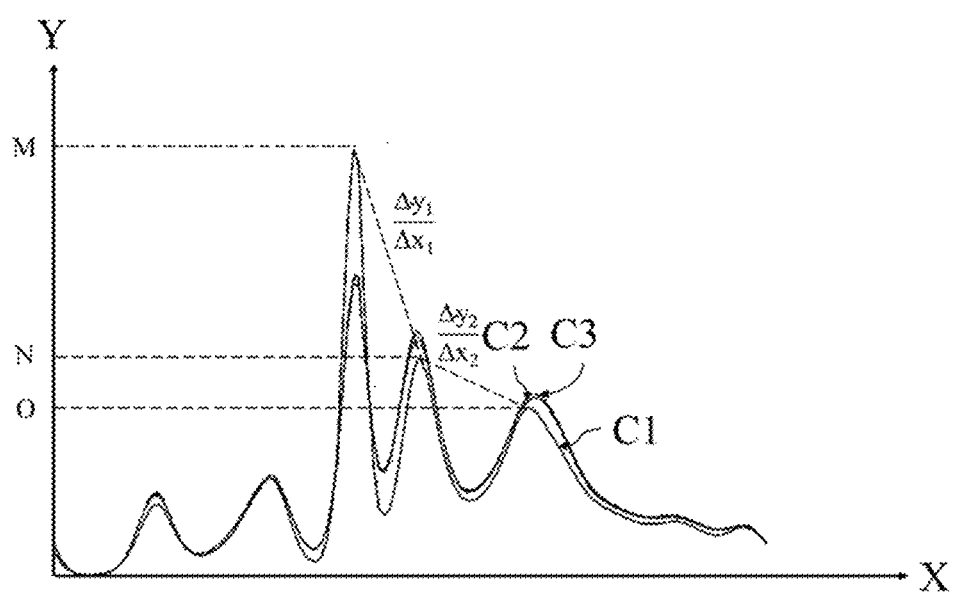
FIG. 4 is a schematic plane diagram showing the Raman spectra data detected at three different targeted arears in a plane of a semiconductor process kit and received by a derivative calculation unit of the data processing system for deterioration detecting system of semiconductor process kits according to one embodiment of the present invention.

Referring to FIG. 1, in one embodiment, the derivative calculation unit 12 of the data processing system 1 for deterioration detecting system of semiconductor process kits is used to receive the Raman spectra data resulted from the alignment calculation unit 11 and to perform ratio calculation with respect to different dimensions on the gaps between any two of all the spectral peaks of each of the Raman spectra data to obtain a first parameter 300 representing changes of the strength of all the spectral peaks of each of the Raman spectra data as the Raman spectra shift changes. Since the Raman spectra data is multidimensional and includes data composed of components in at least two dimensions such as the X axis and the Y axis, the derivative calculation includes at least ratio calculation of the gaps between any two of all the spectral peaks of the Raman spectra data with respect to the X axis and the Y axis. As shown in FIG. 4, in the Raman spectra data C1, C2, and C3 detected at three different targeted areas of the semiconductor process kit 3 under detection, the slope of the gap between the spectra peak strength M and the spectra peak strength N of the Raman spectra data C2 is $\Delta y_1/\Delta x_1$ and represents the ratio of the component in the Y axis to the component in the X axis of the gap between the spectra peak strength M and the spectra peak strength N. Similarly, the slope of the gap between the spectra peak strength N and the spectra peak strength O of the Raman spectra data C1 is $\Delta y_2/\Delta x_2$ and represents the ratio of the component in the Y axis to the component in the X axis of the gap between the spectra peak strength N and the spectra peak strength O. In FIG. 4, the physical quantity in the X axis is Raman shift with the unit being $cm^{-1}$, while the physical quantity in the Y axis is intensity with the unit being au.

Referring to FIG. 1, in one embodiment, the scale normalization unit 13 of the data processing system 1 for deterioration detecting system of semiconductor process kits is used to receive the first parameter 300 resulted from the derivative calculation unit 12 and to perform scaling and normalization on the first parameter 300 to obtain a second parameter 400. The scaling is to adjust the scale of the first parameter 300 in every dimension to make the reading of the first parameter 300 conform to usual habits. For example, the scale of a dimension from 1 to 75 can be adjusted to be from 1 to 100. On the other hand, the normalization is to eliminate the duplicate parts and abnormal parts of the first parameter 300 and therefore to improve the utility of the second parameter 400. In one embodiment, the scaling and normalization performed by the scale normalization unit 13 on the first parameter 300 includes a matrix operation. In other embodiments, the scale normalization unit 13 can be placed between the dimension reduction calculation unit 14 and the standard deviation calculation unit 15, or after the standard deviation calculation unit 15.

Referring to FIG. 1, in one embodiment, the dimension reduction calculation unit 14 of the data processing system 1 for deterioration detecting system of semiconductor process kits is used to receive the second parameter 400 resulted from the scale normalization unit 13, perform dimension reduction calculation on the second parameter 400 to reduce the complexity of the second parameter 400 and simplify the subsequent calculation, and obtain the third parameter 500. In one embodiment, the performed dimension reduction calculation may be a principal component analysis (PCA) calculation which reduces the data into combination of a specific basis and an index corresponding to the specific basis. Since the Raman spectra data is multidimensional and includes data composed of components in at least two dimensions, in case the second parameter 400 is still multidimensional data, the dimension reduction calculation may include a matrix operation to convert the second parameter 400 into matrix data in lower dimensions such as one dimension.

Figure 5:
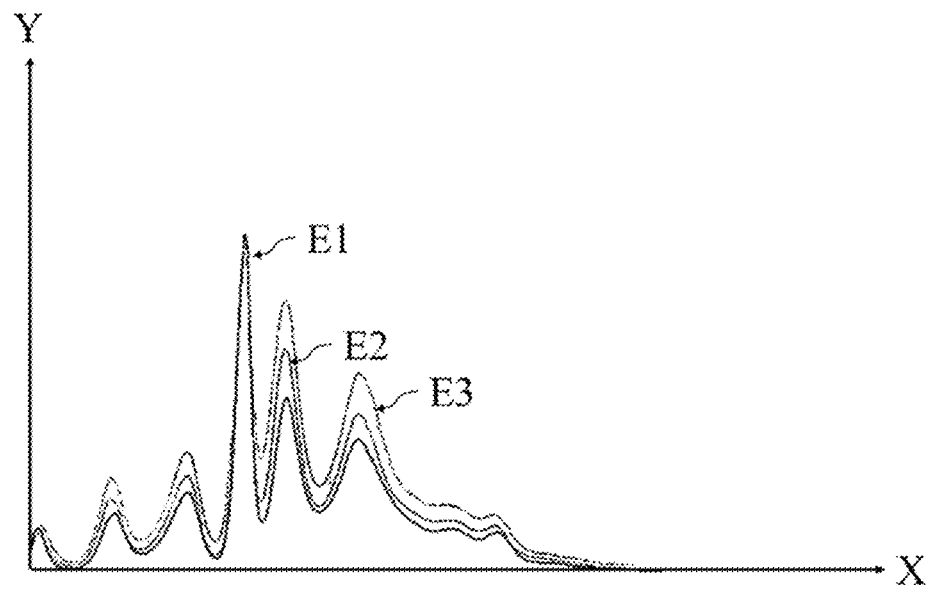
FIG. 5 is a schematic plane diagram showing the Raman spectra simulated for three different external environments in which a semiconductor process kit of the same specification is detected by the data processing system for deterioration detecting system of semiconductor process kits according to one embodiment of the present invention.
Figure 6:
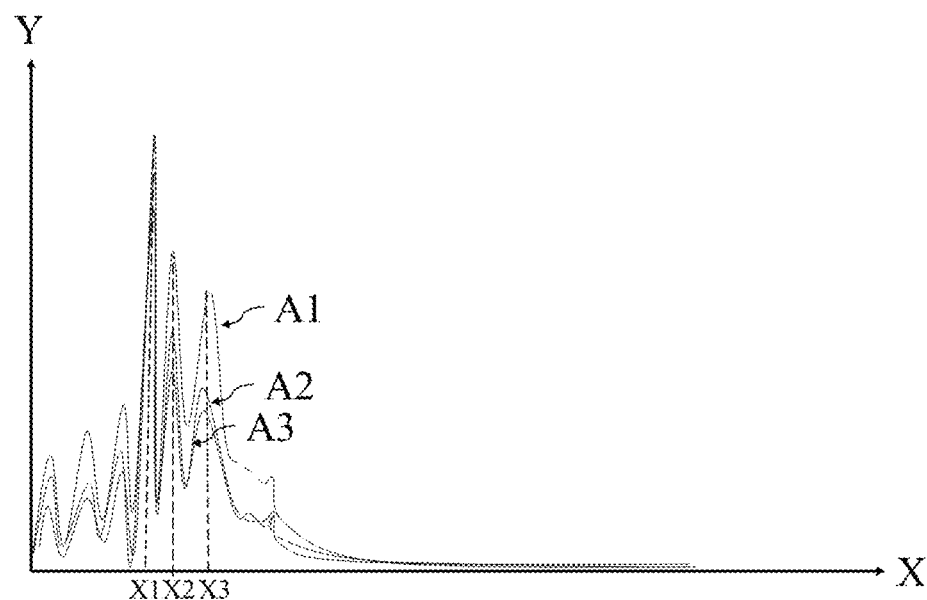
FIG. 6 is a schematic plane diagram showing the Raman spectra data simulated for three different targeted arears in a plane of a semiconductor process kit by the data processing system for deterioration detecting system of semiconductor process kits according to one embodiment of the present invention.

Still referring to FIG. 1, in one embodiment, the standard deviation calculation unit 15 of the data processing system 1 for deterioration detecting system of semiconductor process kits is used to receive the third parameter 500 resulted from the dimension reduction calculation unit 14 and to perform standard deviation calculation on the third parameter 500 to obtain two deterioration state determining parameters 16, i.e., the life index and the discrete degree. The life index is used to represent and/or indicate the aging degree of the semiconductor process kit under detection or a specific semiconductor process kit in different external environments, while the discrete degree is used to represent and/or indicate degree of variation of the internal molecular structure at different internal locations of the semiconductor process kit under detection or the specific semiconductor process kit. As shown in FIG. 5, E1, E2, E3 are the Raman spectra data respectively simulated for the same semiconductor process kit in three different external environments by a data processing system 1 for deterioration detecting system of semiconductor process kits according to one embodiment of the present invention, wherein the physical quantity in the X axis is Raman shift with the unit being $cm^{-1}$, while the physical quantity in the Y axis is intensity with the unit being au. As shown in FIG. 5, the spectral peak strength of the simulated Raman spectra data reflects the aging degree of the semiconductor process kit. The lower spectra peak strength usually means the lower aging degree. Therefore, the aging degree of the semiconductor process kit can be determined by the spectral peak strength of the simulated Raman spectra data, and the life index resulted from the standard deviation calculation unit 15 relates to an average value resulted from the standard deviation calculation, representing and/or indicating an average value of the spectral peak strength of the simulated Raman spectra data. In the present invention, it is better to have smaller life index. Preferably, a life index is 90 or less. On the other hand, referring to FIG. 6, the Raman spectra data simulated for the same semiconductor process kit at three different targeted areas A1, A2, A3 by a data processing system 1 for deterioration detecting system of semiconductor process kits according to another embodiment of the present invention are shown, wherein the physical quantity in X axis is Raman shift with the unit being $cm^{-1}$, the physical quantity in Y axis is intensity with the unit being au. As shown in FIG. 6, the variety of the gaps between the spectra peak strengths of the simulated Raman spectra data respectively corresponding to the positions X1, X2, X3 in the X axis reflect the degree of variation of the internal molecular structure of the semiconductor process kit at different internal locations. Smaller variety usually represents lower degree of variation of the internal molecular structure. For example, in FIG. 6, when the gaps between the spectra strength of the different targeted areas A1, A2, A3 corresponding to position X1 and the gaps between the spectra strength of the different targeted areas A1, A2, A3 corresponding to position X2 are consistent or with little change, the degree of variation of the internal molecular structure of the semiconductor process kit would be low. When the gaps between the spectra strength of the different targeted areas A1, A2, A3 corresponding to position X1 and the gaps between the spectra strength of the different targeted areas A1, A2, A3 corresponding to position X2 are quite different, the degree of variation of the internal molecular structure of the semiconductor process kit would be high, which means the deterioration degree is large. Therefore, the deterioration degree of the semiconductor process kit can be determined from the variety of the spectra peak strengths corresponding to the location of each spectra peak of the Raman spectra data simulated by the standard calculation. In other words, the discrete degree obtained from the standard deviation calculation unit 15 relates to the discrete value resulted from the standard deviation calculation and represents and/or indicates variety between the spectra peak strengths of the simulated Raman spectra data. In the present invention, it is better to have smaller discrete degree. Preferably, the discrete degree is 1.5 or less.

As result, as shown in FIG. 1, not only the deterioration of the semiconductor process kit 3 under detection can be directly detected by the deterioration detecting system 2, the detected Raman spectra data can also be inputted into a data processing system 1 for the deterioration detecting system 2 via or not via the Raman spectra database unit 24 to obtain the deterioration state determining parameters 16 including the life index and the discrete degree which can be further used to predict lifetime of each semiconductor process kit. For example, when the semiconductor process kit 3 under detection is new and the aging degree influenced by the external environment of the semiconductor process kit 3 is too low to reflect the real deterioration of the semiconductor process kit 3, the value of the simultaneously obtained discrete degree can be used to determine whether the inside of the semiconductor process kit 3 is in a severe deterioration and the semiconductor process kit 3 is actually a defective product and therefore to lower evaluation of the lifetime of the semiconductor process kit 3 so as to avoid late replacement of the defective products. On the other hand, when the semiconductor process kit 3 under detection is old and the aging degree influenced by the external environment of the semiconductor process kit 3 is too high and therefore over reflects the real deterioration of the semiconductor process kit 3, the value of the simultaneously obtained discrete degree can be used to determine whether the inside of the semiconductor process kit 3 is in a slight deterioration and the semiconductor process kit 3 is actually can be used and therefore to raise evaluation of the lifetime of the semiconductor process kit 3 so as to avoid early replacement of the defective products.

Figure 7:
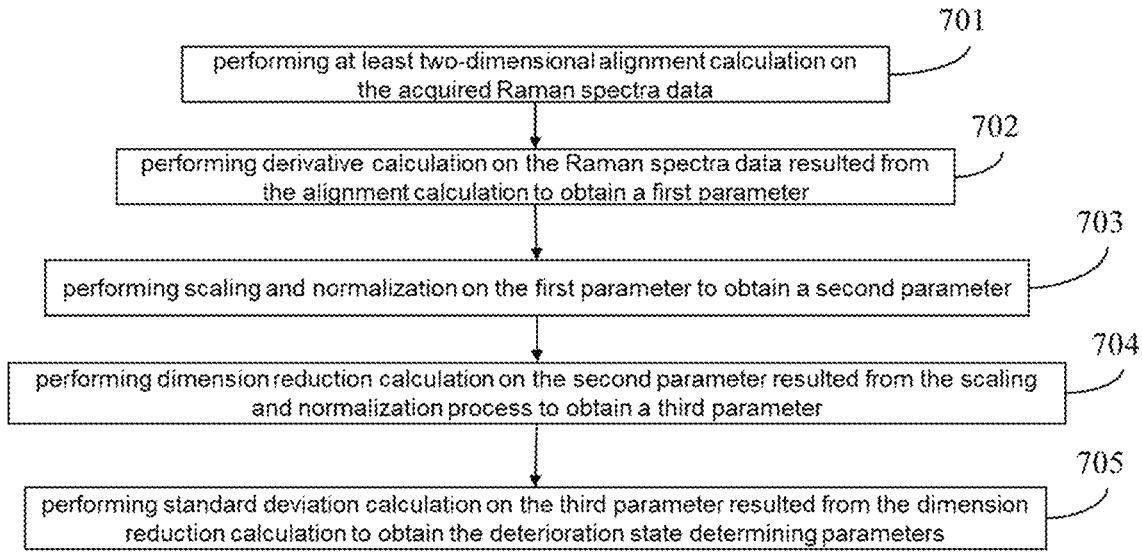
FIG. 7 is a flow chart showing a data processing method for deterioration detecting system of semiconductor process kits according to one embodiment of the present invention.

FIG. 7 is a flow chart showing a data processing method for deterioration detecting system of semiconductor process kits according to one embodiment of the present invention. As shown in FIG. 7, in one embodiment, the data processing method for deterioration detecting system of a semiconductor process kit includes the flowing steps performed with a data processing system being a computing system that may have a microprocessor: acquiring a plurality of Raman spectra data of a semiconductor process kit; and performing a plurality calculating processes on the Raman spectra data to obtain a first deterioration state determining parameter indicating the aging degree of the semiconductor process kit and a second deterioration state determining parameter indicating the degree of variation of the internal molecular structure of the semiconductor process kit. Ash shown in FIG. 1, the acquired Raman spectra data may be data of a semiconductor process kit 3 under detection detected by the deterioration detecting system 2 of a semiconductor process kit, or a plurality of Raman spectra data stored in the Raman spectra database unit 24 corresponding to a plurality of known use hours, a plurality of known materials, a plurality of known material compounds, or a plurality of known deterioration states of the materials of various semiconductor process kits, or the otherwise inputted Raman spectra data of the semiconductor process kit. The calculating processes performed on the acquired Raman spectra data include the flowing steps.

Step 701: performing at least two-dimensional alignment calculation on the acquired Raman spectra data. In one embodiment, the alignment calculation performed on the acquired Raman spectra data includes performing error unification calculation, which may include a matrix operation, on the Raman spectra data in all dimensions to eliminate inconsistency of the detection results of the same semiconductor process kit under detection from different deterioration detecting system of the semiconductor process kits. Since the Raman spectra data is multidimensional and includes data composed of components in at least two dimensions such as the X axis and the Y axis, the alignment calculation of the Raman spectra data includes alignment calculations with respect to at least the X axis and the Y axis for the coordinate values.

Step 702: performing derivative calculation on the Raman spectra data resulted from the alignment calculation to obtain a first parameter. In one embodiment, the derivative calculation to be performed includes performing ratio calculation with respect to different dimensions on the gaps between any two of all the spectral peaks of each of the Raman spectra data to obtain the first parameter representing and/or indicating changes of the strength of all the spectral peaks of each of the Raman spectra data as the Raman spectra shift changes. Since the Raman spectra data is multidimensional, the derivative calculation includes at least ratio calculation of the gaps between any two of all the spectral peaks of the Raman spectra data with respect to the X axis and the Y axis.

Step 703: performing scaling and normalization on the first parameter to obtain a second parameter. In one embodiment, the scaling to be performed is adjusting the scale of the first parameter in every dimension to make the reading of the first parameter conform to usual habits. For example, the scale of a dimension from 1 to 75 can be adjusted to be from 1 to 100. On the other hand, the normalization to be performed is eliminating the duplicate parts and abnormal parts of the first parameter to improve the utility of the second parameter. In one embodiment, the scaling and normalization to be performed may include a matrix operation.

Step 704: performing dimension reduction calculation on the second parameter resulted from the scaling and normalization process to obtain a third parameter. In one embodiment, the performed dimension reduction calculation may be a principal component analysis (PCA) calculation which reduces the data into combination of a specific basis and an index corresponding to the specific basis. Since the Raman spectra data is multidimensional, the dimension reduction calculation to be performed may include a matrix operation to convert the second parameter into the matrix data in lower dimensions such as one dimension.

Step 705: performing standard deviation calculation on the third parameter resulted from the dimension reduction calculation to obtain the deterioration state determining parameters. In one embodiment, the deterioration state determining parameters include life index and discrete degree. The life index is used to represent and/or indicate the aging degree of the semiconductor process kit under detection or a specific semiconductor process kit in different external environments. The discrete degree is used to represent and/or indicate degree of variation of the internal molecular structure at different internal locations of the semiconductor process kit under detection or the specific semiconductor process kit. The life index relates to an average value resulted from the standard deviation calculation and represents and/or indicates an average value of the spectral peak strength of the simulated Raman spectra data. The discrete degree relates to a discrete value resulted from the standard deviation calculation and represents and/or indicates variety between the spectra peak strengths of the simulated Raman spectra data.

Figure 8:
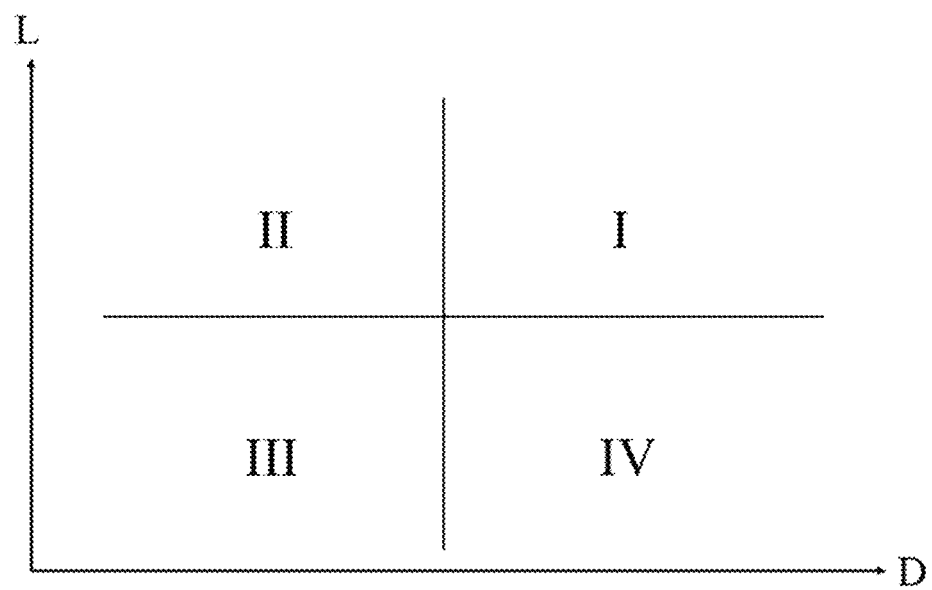
FIG. 8 is a schematic plane diagram showing the relationships between the deterioration of a semiconductor process kit and the life index and the discrete degree resulted from the data processing system for deterioration detecting system of semiconductor process kits according to one embodiment of the present invention.

FIG. 8 is a schematic plane diagram showing the relationships between the deterioration of a semiconductor process kit and the life index and the discrete degree resulted from the data processing system for deterioration detecting system of semiconductor process kits according to one embodiment of the present invention. As shown in FIG. 8, when the life index L is taken as the longitudinal coordinate axis and the discrete degree D is taken as the transversal coordinate axis, the region III, in the four regions of the L-D plane, having the lowest life indices and the lowest discrete degrees represents and/or indicates the semiconductor process kit having the smallest deterioration and the best use state. Otherwise, the regions I, II, IV each having larger life indices or larger discrete degrees represent and/or indicate the semiconductor process kit having the larger deterioration and poor use state. Accordingly, the lifetime of each semiconductor process kit can be predicted to early aware of the deterioration of each semiconductor process kit by merely judging the life index and the discrete degree.

In sum, the data processing method and system for deterioration detection of semiconductor process kits according to the described embodiments of the present invention are utilized to obtain the life index and discrete degree for predicting the lifetime of various semiconductor process kits via performing algorithm including alignment calculation, derivative calculation, scale normalization, dimensional reduction calculation, and standard deviation calculation on the detected Raman spectra data. Since the life index and discrete degree are one-dimensional data converted from the detected Raman spectra data, the interpretation complexity of the Raman spectra data is reduced, the detection personnel can keep abreast of the use state of various semiconductor process kits without interpreting the Raman spectra data, the lifetime of various semiconductor process kits can be predicted based on only the numerical value of the life index and the discrete degree, and therefore the use efficiency of the semiconductor process kits can be improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangement.

What is claimed is:

1. A data processing method for detection of deterioration of semiconductor process kits to predict lifetime of the semiconductor process kits, comprising:
receiving Raman spectra data detected on a semiconductor process kit under detection by a deterioration detecting system having at least a Raman spectrometer, an optical detecting unit adapted to the Raman spectrometer, a controlling-computing unit adapted to the Raman spectrometer, and a Raman spectra database unit adapted to the controlling-computing unit, and stored in the Raman spectra database unit, with a data processing system having a microprocessor and connecting to the deterioration detecting system;
performing at least two-dimensional alignment calculation with the microprocessor on the received Raman spectra data to eliminate inconsistency of the deterioration detection of the semiconductor process kit under detection within different deterioration detecting systems of the semiconductor process kits;
performing derivative calculation with the microprocessor on the Raman spectra data resulted from the alignment calculation to perform ratio calculation with respect to different dimensions on gaps between any two of all spectral peaks of each of the Raman spectra data to obtain a first parameter representing changes of strength of all the spectral peaks of each of the Raman spectra data as the Raman spectra shift changes;
performing scaling and normalization with the microprocessor on the first parameter to adjust scale of the first parameter in every dimension and eliminate duplicate and abnormal parts of the first parameter to obtain a second parameter;
performing dimension reduction calculation with the microprocessor on the second parameter to reduce complexity of the second parameter and simplify the subsequent calculation to obtain a third parameter; and
performing standard deviation calculation with the microprocessor on the third parameter to obtain a first deterioration state determining parameter and a second deterioration state determining parameter, wherein the first deterioration state determining parameter relates to an average value resulted from the standard deviation calculation and is used to indicate aging degree of the semiconductor process kit, while the second deterioration state determining parameter relates to a discrete value resulted from the standard deviation calculation and is used to indicate degree of variation of internal molecular structure of the semiconductor process kit;
wherein the first deterioration state determining parameter and the second deterioration state determining parameter are used to predict lifetime of the semiconductor process kit.

2. The data processing method of claim 1, wherein one of the alignment calculation, the scaling and normalization, and the dimension reduction calculation includes a matrix operation.

3. A data processing system for detection of deterioration of semiconductor process kits to predict lifetime of the semiconductor process kits, comprising:
an alignment calculation unit to receive a plurality of Raman spectra data of a semiconductor process kit under detection and perform error unification calculation on the Raman spectra data with respect to all dimensions to eliminate inconsistency of the detection results of the semiconductor process kit under detection within different deterioration detecting systems of the semiconductor process kits, wherein the Raman spectra data of the semiconductor process kit is stored in multiple Raman spectra database units each included in a deterioration detecting system having a Raman spectrometer;
a derivative calculation unit being electrically connected with the alignment calculation unit to receive the Raman spectra data resulted from the alignment calculation unit and to perform ratio calculation with respect to different dimensions on the gaps between any two of all the spectral peaks of each of the resulted Raman spectra data to obtain a first parameter representing changes of the strength of all the spectral peaks of each of the Raman spectra data as the Raman spectra shift changes;

a scale normalization unit being electrically connected with the derivative calculation unit to receive the first parameter and to perform scaling and normalization on the first parameter to adjust scale of the first parameter in every dimension and eliminate duplicate and abnormal parts of the first parameter to obtain a second parameter;

a dimension reduction calculation unit being electrically connected with the scale normalization unit to receive the second parameter and to perform dimension reduction calculation on the second parameter to reduce complexity of the second parameter and simplify the subsequent calculation to obtain a third parameter;

a standard deviation calculation unit being electrically connected with the dimension reduction calculation unit to receive the third parameter and to perform standard deviation calculation on the third parameter to obtain a first deterioration state determining parameter relating to an average value resulted from the standard deviation calculation and a second deterioration state determining parameter relating to a discrete value resulted from the standard deviation calculation; and a microprocessor being electrically connected with the alignment calculation unit, the derivative calculation unit, the scale normalization unit, the dimension reduction calculation unit, and the standard deviation calculation unit to execute all the calculations;

wherein the first deterioration state determining parameter is used to indicate aging degree of the semiconductor process kit while the second deterioration state determining parameter is used to indicate degree of variation of internal molecular structure of the semiconductor process kit, and lifetime of the semiconductor process kit is predicted by the first deterioration state determining parameter and the second deterioration state determining parameter.

4. The data processing system of claim 3, wherein the first deterioration state determining parameter is life index of the semiconductor process kit with the life index reflecting the aging degree of the semiconductor process parts.

5. The data processing system of claim 4, wherein the life index relates to an average value resulted from the standard deviation calculation.

6. The data processing system of claim 3, wherein the second deterioration state determining parameter is the discrete degree of the semiconductor process kit with the discrete degree reflecting the degree of variation of the internal molecular structure of the semiconductor process kit.

7. The data processing system of claim 6, wherein the discrete degree relates to a discrete value resulted from the standard deviation calculation.

* * * * *